(12) United States Patent
Tegen

(10) Patent No.: US 7,456,086 B2
(45) Date of Patent: Nov. 25, 2008

(54) SEMICONDUCTOR HAVING STRUCTURE WITH OPENINGS

(75) Inventor: Stefan Tegen, Dresden (DE)

(73) Assignee: Infineon Technologies AG, Munich (DE)

( * ) Notice: Subject to any disclaimer, the term of this patent is extended or adjusted under 35 U.S.C. 154(b) by 127 days.

(21) Appl. No.: 11/395,111

(22) Filed: Mar. 31, 2006

(65) Prior Publication Data

US 2006/0281246 A1 Dec. 14, 2006

(30) Foreign Application Priority Data

Mar. 31, 2005 (DE) .................. 10 2005 014 724

(51) Int. Cl.
H01L 21/22 (2006.01)

(52) U.S. Cl. .................. 438/549; 438/700; 438/704; 257/E21.219; 257/E21.251

(58) Field of Classification Search .................. 438/642, 438/647, 749; 257/E21.221, E21.25
See application file for complete search history.

(56) References Cited

U.S. PATENT DOCUMENTS

| | | | |
|---|---|---|---|
| 6,355,567 B1 * | 3/2002 | Halle et al. | .................. 438/700 |
| 6,740,584 B2 | 5/2004 | Eimori | |
| 2002/0056913 A1 * | 5/2002 | Eimori | ....................... 257/758 |

FOREIGN PATENT DOCUMENTS

TW 442964 6/2001

\* cited by examiner

*Primary Examiner*—Michael S. Lebentritt
*Assistant Examiner*—Cheung Lee
(74) *Attorney, Agent, or Firm*—Dicke, Billig & Czaja, PLLC

(57) ABSTRACT

A process for producing an insulation structure with openings of a low aspect ratio is disclosed. In one embodiment, a dopant is introduced into the insulation structure with a concentration which on average increases or decreases in the vertical direction from a pre-processed semiconductor surface, the openings are formed in a dry-etching step and the aspect ratio of the openings is reduced by increasing the basic surface area of the openings using a subsequent wet-chemical etching step.

18 Claims, 3 Drawing Sheets

After the dry etch

After the wet etch

FIG 2A                After the dry etch

After the wet etch

After the dry etch

After the wet etch

Increasing distance from the surface of the semiconductor substrate

US 7,456,086 B2

SEMICONDUCTOR HAVING STRUCTURE WITH OPENINGS

CROSS-REFERENCE TO RELATED APPLICATIONS

This Utility Patent Application claims priority to German Patent Application No. DE 10 2005 014 724.0, filed on Mar. 31, 2005, which is incorporated herein by reference.

BACKGROUND

The development of integrated circuits, such as processors or memories, is driven by the increasing miniaturization of the minimum feature sizes of the components. The density of components on a semiconductor substrate, such as a silicon wafer, can be increased by reducing the minimum feature sizes, such as for example a channel length of a transistor, which in turn leads to lower costs per chip. When reducing the minimum feature sizes, it is particularly important to produce structures with openings of a low aspect ratio, i.e., a low ratio between a height of the opening and a width of a basic surface area (also referred to below as the footprint or contact surface) of the opening, in order to satisfy for example demands relating to the minimum required capacitance and also with regard to mechanical stability of storage capacitors designed as stacked capacitors in dynamic random access memories (DRAMs).

Structures with openings with a low aspect ratio also allow a low contact resistance at contact holes. In both cases, openings with a low aspect ratio are desirable in order to achieve the largest possible contact surface to the pre-processed semiconductor substrate lying beneath the structure, in the case of DRAMs with a stacked capacitor on account of the required mechanical stability of free-standing, for example cylindrical structures which occur during the process sequence of producing stacked capacitors, which on account of the capillary forces threaten to tilt over and come into contact with one another during a wet-chemical etch. A low contact resistance, for example to active components as a source/drain terminal, can also be achieved by using the largest possible contact surface to the pre-processed semiconductor substrate located beneath the structure, allowing fast switching times.

The publication "Effective Capacitance Enhancement Methods for 90-nm DRAM Capacitors", Journal of the Korean Physical Society, Vol. 44, No. 1, January 2004, pages 112-116, by Y.K. Park et al., proposes an OCS (one cylinder storage node) for improving mechanical stability during the production of stacked capacitors in DRAMs. In this case, two oxide layers, for example a BPSG (boron phosphorous silicate glass) layer and a PETEOS (plasma-enhanced tetra-ethyl-ortho-silicate) layer, are stacked on top of one another, and openings are introduced by anisotropic etching. A wet-chemical etching step is used to increase the contact surface to the semiconductor substrate formed beneath the two oxide layers.

For these and other reasons there is a need for the present invention.

SUMMARY

The present invention relates to a process for producing a structure with openings on a pre-processed semiconductor substrate. In one embodiment, invention includes a process for producing an insulation structure with openings of a low aspect ratio. A dopant is introduced into the insulation structure with a concentration which on average increases or decreases in the vertical direction from a pre-processed semiconductor surface, the openings are formed in a dry-etching process and the aspect ratio of the openings is reduced by increasing the basic surface area of the openings using a subsequent wet-chemical etching process.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Further features and advantages of the invention can be seen from the following description with reference to the drawings.

FIGS. 2A and 2B illustrates a cross-sectional view through two oxide layers stacked on top of one another, with an opening, before and after a wet-chemical etching process.

DETAILED DESCRIPTION

Figure 1:
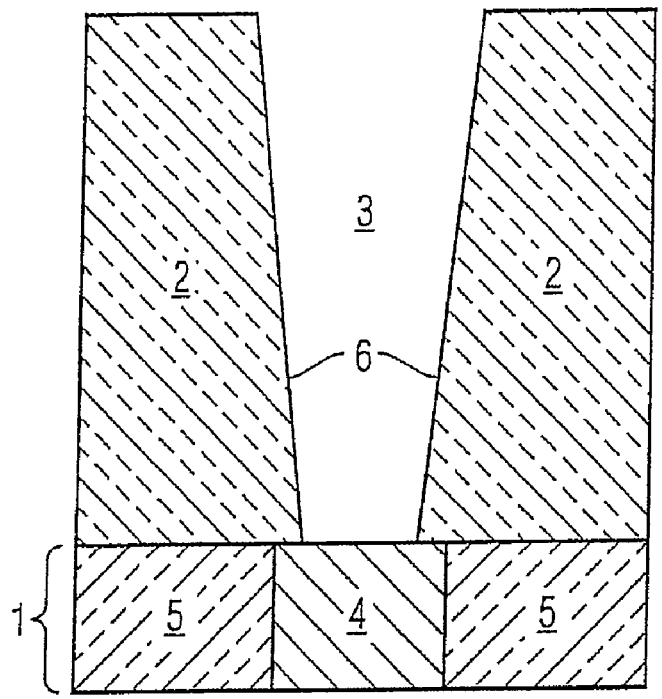
FIG. 1 illustrates a cross-sectional view through a structure with opening in accordance with the prior art.
Figure 1:
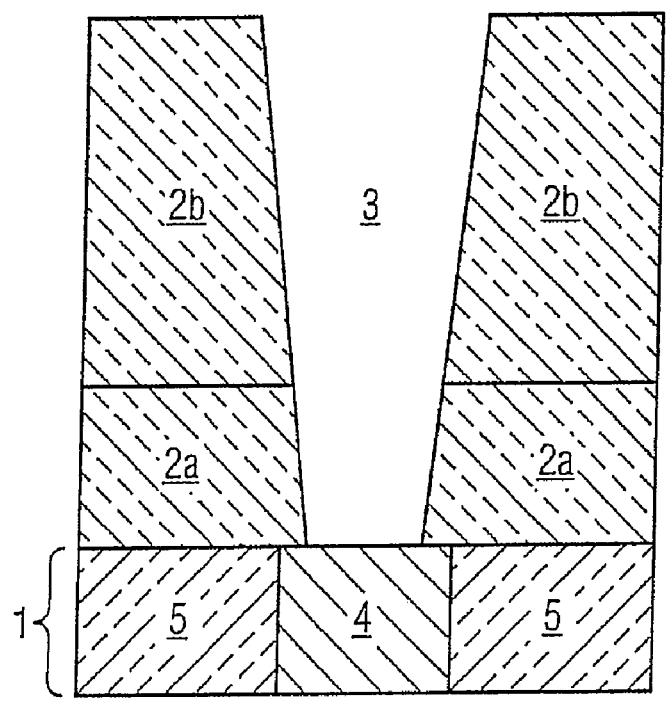

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a process for producing a structure with openings of a low aspect ratio, so that the largest possible basic surface areas can be achieved.

In one embodiment, the invention provides a process for producing a structure with openings on a pre-processed semiconductor substrate, by providing the pre-processed semiconductor substrate, applying the structure to a surface of the pre-processed semiconductor substrate, producing a capping layer on the structure and removing the capping layer in regions where the openings are to be formed and also removing the structure in the regions where the openings are to be formed. During or after application of the structure, at least one dopant is introduced into the structure, with the concentration of the at least one dopant varying substantially continuously vertically from the surface of the pre-processed semiconductor substrate toward the capping layer and on average increasing or decreasing from the semiconductor substrate vertically toward the capping layer. At least one dry-etching process and at least one subsequent wet-chemical etching process are carried out in order to remove the structure. The capping layer may, for example, be an etching protection layer in the form of a hard mask and may consist of a material which, during the etching of the openings into the structure, protects regions of the structure located beneath the protective layer and is itself not attacked or is only attacked much more slowly than the structure. By way of example, a capping layer made from TiN can protect a structure made from oxide. The at least one dry-etching process is preferably used to produce the openings. The concentration of the at least one dopant can be set by varying the quantity of a corresponding dopant source supplied during the production of the structure, for example using a mass flow controller, or can be implanted after the structure has been produced. It is also possible for a thermal process to be carried out after the introduction of the at least one dopant, with the result that the distribution of the dopant concentration becomes more uniform as a result of diffusion of the dopant, so that for example concentration profiles which are implanted in step form acquire a more gradual transition.

At this point, it should be expressly noted that a concentration which varies substantially continuously and a multiplicity of successive sub layers of constant concentration, which are thin compared to the thickness of the insulation layer, may be formed, but in the latter case adjacent sub layers have different concentrations. A multiplicity of thin sub layers of this type can be produced, for example, by changing the quantity of the dopant source supplied at intervals and this option provides a substantially continuously varying dopant concentration relative to the thickness of the structure. Such a multiplicity of successive sublayers for forming the structure comprises at least five layers.

It is particularly advantageous for the wet-chemical etching process for reducing the aspect ratio of the openings to be carried out until sidewalls of the openings are formed substantially perpendicular to the surface of the pre-processed semiconductor substrate. This makes it possible, for example, to impart a particularly high mechanical stability to the free-standing structures produced during the formation of the stacked capacitors of DRAM stacked capacitors, such as for example cylinder structures.

It is advantageous for the at least one dopant to be introduced into the structure with a concentration which decreases continuously from the surface of the pre-processed semiconductor substrate vertically toward the capping layer, i.e., at increasing vertical distance from the capping layer or upward. This type of profile of the dopant concentration makes it possible to form a particularly favorable aspect ratio with the aid of subsequent processes.

In one embodiment, boron or phosphorus or a combination thereof is introduced into the structure as dopant. It is in this case possible to influence etching rates of the structure by means of the dopant concentration.

It is particularly advantageous to form the structure from silicon oxide. In this case, the wet-chemical etching rate of the structure can be increased by adding boron or phosphorus as dopant. At this point, it should be noted that a structure which serves as a sacrificial structure (i.e., a structure which is to be removed again during the further sequence of the process) may be any desired conductive or insulating structure, provided that its wet-chemical etching rate can be influenced by adding a dopant. The structure may also be a low-k dielectric which as dopant may, for example, have carbon, $OH^{31}$ groups, hydrogen, nitrogen or a combination thereof.

The wet-chemical etching process is advantageously carried out using dilute hydrofluoric acid as etching solution. Hydrofluoric acid is suitable in particular for the etching of silicon oxide and has increased etching rates with an increase in the dopant concentration of, for example, boron or phosphorus.

If the structure is made from polysilicon, it is particularly advantageous for the dopant to be phosphorus and the wet-chemical etching process to be carried out using at least nitric acid as etching solution. In this case, the desired reduction in the aspect ratio can be achieved by virtue of the fact that the wet-chemical etching rate of the polysilicon is dependent on the dopant concentration of the phosphorus.

Preferably, the structure is made from polysilicon, the dopant corresponds to boron and the boron is introduced into the structure with a concentration which increases continuously from the surface of the pre-processed semiconductor substrate vertically toward the capping layer, and the wet-chemical etching step is carried out using at least nitric acid as etching solution. In this case, the decreasing wet-chemical etching rate with increasing boron concentration is exploited to reduce the aspect ratio.

It is advantageous to use the process according to the invention for forming a structure with openings on a pre-processed semiconductor substrate to produce a stacked capacitor of a DRAM memory component, in which case a first capacitor electrode is produced and patterned following the production of the openings with a low aspect ratio. Then, the structure is removed. This generally wet-chemical removal of the structure leads to the formation of free-standing structures, such as cylinders of capacitor electrode material, which on account of the capillary forces of the wet-chemical etching solution are prone to tilt over and touch one another. The structure, which in this case serves as a sacrificial structure, on account of the openings with a low aspect ratio makes a contribution to significantly improving the mechanical stability of the free-standing structures. By way of example, standard aspect ratios of the structure, embodied as an oxide layer, for forming stacked capacitors of a DRAM, given a typical oxide layer thickness of approximately 1.5 μm, are approximately 10:1, which leads to an angle of the sidewalls relative to the pre-processed semiconductor substrate of approximately 85°. This angle can be improved from 85° toward the target value of 90° with the aid of the process according to the invention. After the structure has been removed, a capacitor dielectric and a second capacitor electrode are produced and patterned, after which the DRAM can be completed.

It is particularly advantageous for the process according to the invention for forming a structure with openings to be used to produce an intermediate dielectric with contact openings. In this case, after the openings with a low aspect ratio have been produced, they are filled with a conductive material, such as for example tungsten. The low aspect ratio provides a larger contact surface for connection to a contact region lying beneath the structure, for example a source or drain terminal of an MOS (metal oxide semiconductor) transistor. It is in this way possible to achieve lower contact resistances.

FIG. 1 illustrates a structure 2 with opening 3 in accordance with the prior art which has been formed on a pre-processed semiconductor substrate 1, only part of which is illustrated. The pre-processed semiconductor substrate has a contact region 4, for example made from metal, and an insulation region 5, for example an oxide. The structure 2 is used, for example, as an intermetal dielectric and can be formed as an oxide. The aspect ratio of the opening 3 is determined by the etching process, and sidewalls 6 of the openings 3 usually have an orientation other than 90° relative to the surface of the pre-processed semiconductor substrate 1. Consequently, filling of the opening 3 with a conductive material, for example to form contact plugs, leads to a smaller contact surface with the pre-processed semiconductor substrate 1 located beneath the structure 2 compared to a layer located above the structure. Also, during the formation of a stacked capacitor based on the structure shown in FIG. 1, as envisaged in the further process sequence, this capacitor would have a low mechanical stability, since a free-standing structure to be formed during the process sequence, for example a cylinder structure as first capacitor electrode made from polysilicon, on account of the orientation of the sidewalls 6 in the structure 2 differing from 90° with respect to the surface, likewise has sidewalls at an orientation other than 90° to the surface. This results in a small footprint and mechanical instability, which leads to free-standing structures of this type tilting over and being superimposed on one another in particular during a wet-chemical treatment, on account of the capillary forces that are then active.

FIG. 2A illustrates a known approach used to improve the aspect ratio, according to which a first insulation structure 2a and a second insulation structure 2b as oxide layers are formed on top of one another on a pre-processed semiconductor substrate 1, and an opening 3 is introduced into the first insulation structure 2a and into the second insulation structure 2b with the aid of a dry-etching process. The first insulation structure 2a in this case has a greater dopant concentration than the second insulation structure 2b.

Figure 2B:
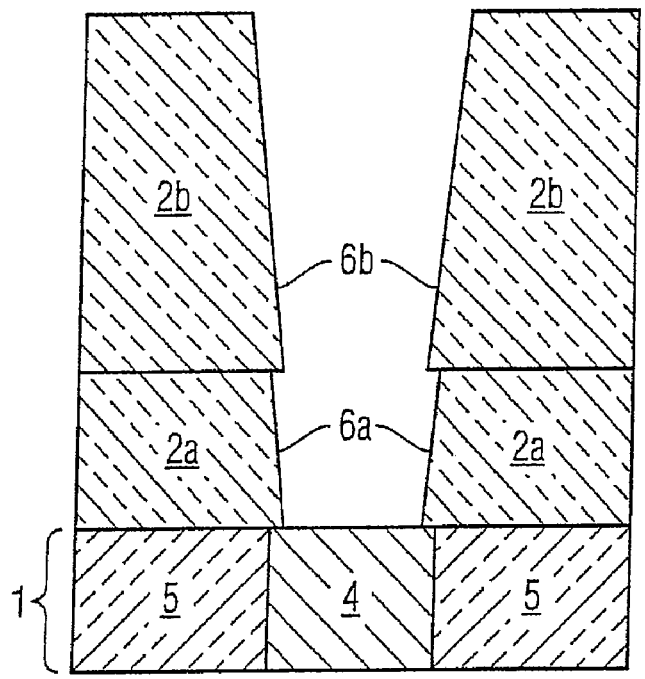

A wet-chemical etching process is carried out to improve the aspect ratio of the opening 3 illustrated in FIG. 2A, resulting in the structure illustrated in FIG. 2B. The wet-chemical etching process leads to more extensive widening of the sidewalls 6a of the first insulation structure 2a compared to the sidewalls 6b of the second insulation structure 2b, resulting in an improvement in the aspect ratio. As described above, depending on the definition of the opening 3, this leads for example to advantageous contact resistances and improved producibility of stacked capacitors of DRAMs.

Figure 3A:
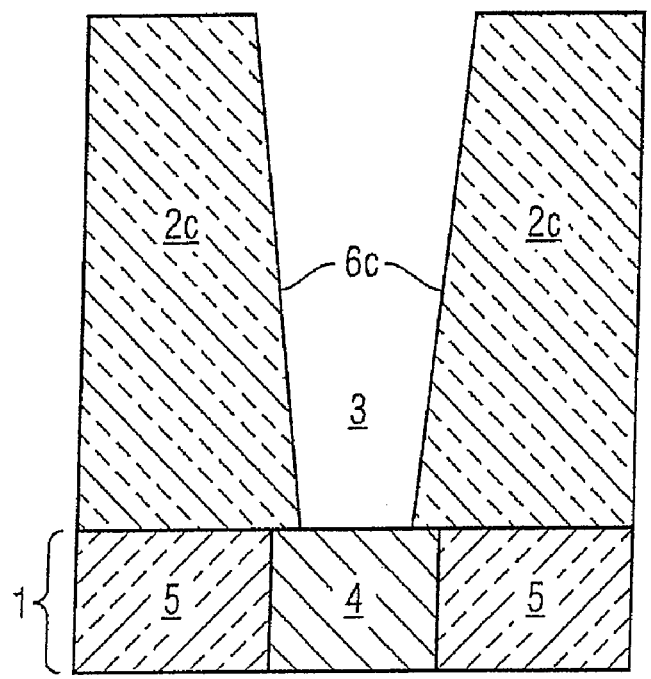
FIGS. 3A and 3B illustrates a cross-sectional view through an embodiment of a structure with opening according to the invention before and after a wet-chemical etch.

FIG. 3A illustrates a diagrammatic cross-sectional view through an embodiment of the invention. In this case, a structure 2c, in particular a layer of silicon oxide, with a concentration of a dopant which on average decreases vertically upward from the semiconductor substrate 1, is produced on a pre-processed semiconductor substrate 1. The structure 2c is preferably formed with a thickness in the range from 1500 nm to 3000 nm, although other layer thicknesses can also be used as the basis for the further processing. It is preferable for the structure 2c to be produced as a CVD layer at a temperature in the range from 200 to 600° C., a pressure in the range from 1 to 10 Torr, an SiH4 flow rate of approximately 100 to 2000 sccm and an N2 flow rate of approximately 1000 to 100000 sccm. Suitable dopants are in particular boron, phosphorus or a combination of boron and phosphorus, with the maximum concentration of the dopant in the structure 2c at the surface toward the pre-processed semiconductor substrate 1 preferably being in the range from approximately 2% to approximately 10%. The concentration of the dopant on average decreases upward, i.e., with increasing vertical distance from the surface of the semiconductor substrate, to a lower value of approximately 0% to 5%, depending on the maximum concentration. A dry-etching step leads to the formation of the opening 3. The dry-etching step is preferably carried out as a plasma etching step at a cathode temperature in the range from −20° C. to 100° C., a wall temperature in the range from −20° C. to 100° C., a pressure from 5 to 500 mTorr, a power of 1000-5000 W, a bias power of 1000-6000 W, an $O_2$ flow rate of 5 to 50 sccm, an Ar flow rate of 300-1800 sccm, a CH2F2 flow rate of 0 to 50 sccm, a C3F8 flow rate of 0 to 50 sccm and a C4F6 flow rate of 0 to 50 sccm.

Figure 3B:
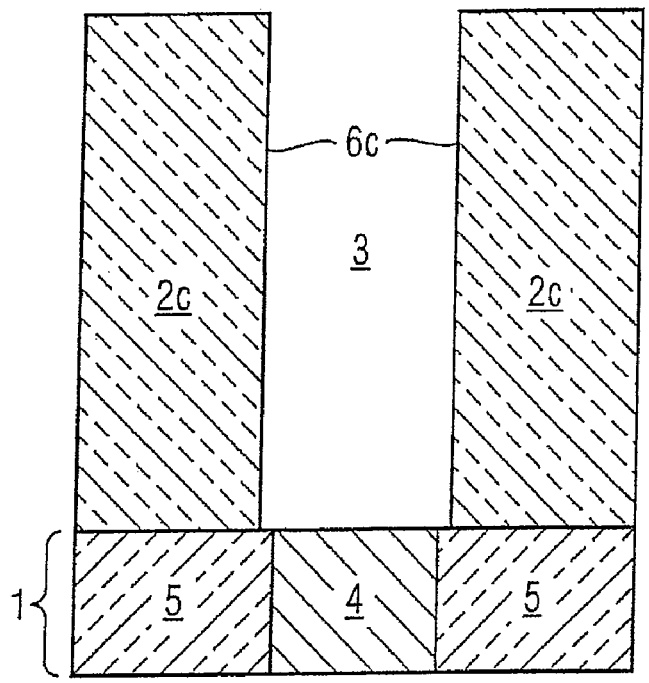

Following the dry-etching process, a wet-chemical etching process is carried out, after which the structure 2c with opening 3 of improved aspect ratio shown in FIG. 3B results. The wet-chemical etching process is preferably carried out using hydrofluoric acid with a dilution in the range from approximately 50:1 to 500:1. On account of the concentration of the dopant decreasing from the pre-processed semiconductor substrate 1 upward, the opening 3 is widened to an increasing extent from the top downward, which is attributable to increased etching rates of the structure 2c with an increased concentration of the dopant. The widening of the opening 3 takes place in such a manner that the sidewalls 6c are ideally perpendicular to the surface of the pre-processed semiconductor substrate 1, so that for example a particularly advantageous footprint in terms of mechanical stability of a DRAM stacked capacitor that is subsequently to be formed results.

Figure 4:
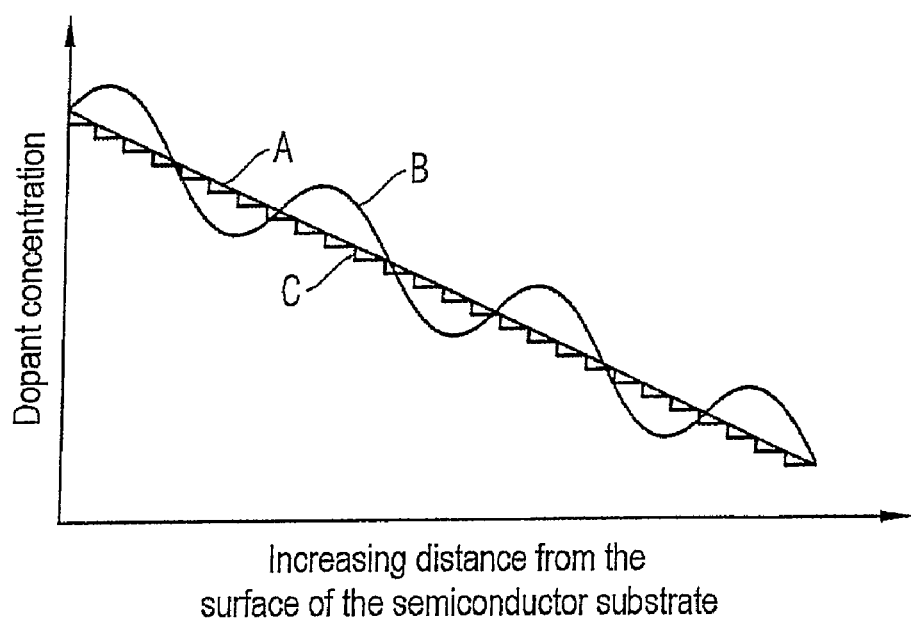
FIG. 4 illustrates exemplary embodiments of dopant concentration profiles in the structure according to the invention.

FIG. 4 illustrates a diagrammatic illustration of advantageous concentration profiles for the dopant within the structure 2c. The profile illustrated from left to right corresponds to a corresponding profile of the concentration within the structure 2c in FIGS. 3A or 3B from the bottom upward. A indicates a linearly decreasing profile of the dopant concentration, in which case a constant dopant gradient is present. B denotes a profile of the dopant concentration which decreases on average but has a modulation with a variable dopant gradient. It is in this way possible, for example, to increase the surface area of the sidewalls, which is advantageous in order to increase the capacitor surface area in particular for DRAMs with storage capacitor. It is also possible, cf. C in FIG. 4, to reduce the dopant concentration substantially continuously in the form of a multiplicity of stepped reductions at increasing vertical distance from the surface of the pre-processed semiconductor substrate 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A process for manufacturing an integrated circuit on a pre-processed substrate comprising:

providing the pre-processed substrate with a structure arranged on the substrate;

producing a capping layer on the structure and removing the capping layer in regions where openings are to be formed;

removing the structure in the regions where the openings are to be formed;

wherein at least one dopant is introduced into the structure, with the concentration of the at least one dopant varying substantially continuously vertically from the surface of the pre-processed semiconductor substrate toward the capping layer and on average increasing or decreasing from the semiconductor substrate vertically toward the capping layer;

carrying out at least one dry-etching process; and carrying out at least one subsequent wet-chemical etching process until sidewalls of the openings are formed substantially perpendicular to the surface of the pre-processed substrate.

2. The process as claimed in claim 1, wherein the structure is made from polysilicon, the dopant is boron, the boron is introduced into the structure with a concentration which increases continuously from the surface of the pre-processed semiconductor substrate vertically toward the capping layer, and the wet-chemical etching step is carried out using at least nitric acid as etching solution.

3. The process as claimed in claim 1, wherein the at least one dopant is introduced into the structure with a concentration which decreases continuously from the surface of the pre-processed semiconductor substrate vertically toward the capping layer.

4. The process as claimed in claim 3, wherein the structure is made from polysilicon, the dopant is phosphorus and the wet-chemical etching step is carried out using at least nitric acid as etching solution.

5. The process as claimed in claim 1, wherein Boron or Phosphorus or a combination thereof is introduced into the structure as dopant.

6. The process as claimed in claim 5, wherein the structure is formed from silicon oxide or an oxide of silicon-germanium.

7. The process as claimed in claim 6, wherein the wet-chemical etching process is carried out using dilute hydrofluoric acid as etching solution.

8. The process as claimed in claim 1, further comprising producing first capacitor electrodes, removing the structure to form free standing pillars of the first capacitor electrodes, providing a capacitor dielectric and a second capacitor electrode on the first capacitor electrode.

9. The process as claimed in claim 8, wherein the structure is made from polysilicon, the dopant is boron, the boron is introduced into the structure with a concentration which increases continuously from the surface of the pre-processed semiconductor substrate vertically toward the capping layer, and the wet-chemical etching step is carried out using at least nitric acid as etching solution.

10. The process as claimed in claim 8, wherein the at least one dopant is introduced into the structure with a concentration which decreases continuously from the surface of the pre-processed semiconductor substrate vertically toward the capping layer.

11. The process as claimed in claim 8, wherein the structure is made from polysilicon, the dopant is phosphorus and the wet-chemical etching step is carried out using at least nitric acid as etching solution.

12. The process as claimed in claim 8, wherein Boron or Phosphorus or a combination thereof is introduced into the structure as dopant.

13. The process as claimed in claim 12, wherein the structure is formed from silicon oxide or an oxide of silicon-germanium.

14. The process as claimed in claim 13, wherein the wet-chemical etching process is carried out using dilute hydrofluoric acid as etching solution.

15. The process of claim 1, further comprising filling the openings with a conductive material.

16. The process as claimed in claim 15, wherein the structure is made from polysilicon, the dopant is boron, the boron is introduced into the structure with a concentration which increases continuously from the surface of the pre-processed semiconductor substrate vertically toward the capping layer, and the wet-chemical etching step is carried out using at least nitric acid as etching solution.

17. The process as claimed in claim 15, wherein the at least one dopant is introduced into the structure with a concentration which decreases continuously from the surface of the pre-processed semiconductor substrate vertically toward the capping layer.

18. A process for manufacturing an integrated circuit on a pre-processed substrate comprising:

providing the pre-processed substrate with a structure arranged on the substrate;

producing a capping layer on the structure and removing the capping layer in regions where openings are to be formed;

removing the structure in the regions where the openings are to be formed;

wherein at least on dopant is introduced into the structure, with the concentration of the at least one dopant varying substantially continuously vertically from the surface of the pre-processed semiconductor substrate toward the capping layer and on average increasing or decreasing from the semiconductor substrate vertically toward the capping layer;

carrying out at least one dry-etching process; and carrying out at least one subsequent wet-chemical etching process to reduce a taper of sidewalls of the openings.

* * * * *